(12) United States Patent
Yoshino et al.

(10) Patent No.: US 10,916,900 B2
(45) Date of Patent: Feb. 9, 2021

(54) CABLE

(71) Applicant: Sony Corporation, Tokyo (JP)

(72) Inventors: Yoshitaka Yoshino, Tokyo (JP); Satoru Tsuboi, Kanagawa (JP); Tomomichi Murakami, Tokyo (JP); Makoto Makishima, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/682,858

(22) Filed: Nov. 13, 2019

(65) Prior Publication Data

US 2020/0091663 A1  Mar. 19, 2020

Related U.S. Application Data

(63) Continuation of application No. 16/067,219, filed as application No. PCT/JP2015/004655 on Oct. 21, 2016, now abandoned.

(30) Foreign Application Priority Data

Jan. 15, 2016 (JP) ................................. 2016-005896

(51) Int. Cl.
  *H01R 13/719* (2011.01)
  *H01R 13/6598* (2011.01)
  (Continued)

(52) U.S. Cl.
  CPC ........... *H01R 13/719* (2013.01); *H01B 9/003* (2013.01); *H01R 13/6581* (2013.01); *H01R 13/6598* (2013.01); *H03H 7/0115* (2013.01); *H05K 9/0098* (2013.01); *H01B 11/1083* (2013.01); *H01R 13/6625* (2013.01);
  (Continued)

(58) Field of Classification Search
  CPC ............ H01R 2107/00; H01R 13/6581; H01R 13/6598; H01R 13/6625; H01R 13/6633; H01R 13/719; H01R 24/60; H01R 24/62; H01B 11/1083; H01B 9/003; H03H 7/0115; H05K 9/0098
  See application file for complete search history.

(56) References Cited

U.S. PATENT DOCUMENTS 6,252,163 B1  6/2001  Fujimori et al.
7,173,182 B2  2/2007  Katsuyama et al.
(Continued)

FOREIGN PATENT DOCUMENTS

CN  101013786 A  8/2007
CN  101752740 A  6/2010
(Continued)

OTHER PUBLICATIONS

U.S. Appl. 16/067,219, filed Jun. 29, 2018, Yoshino et al.
(Continued)

*Primary Examiner* — Edwin A. Leon
*Assistant Examiner* — Matthew T Dzierzynski
(74) *Attorney, Agent, or Firm* — Wolf, Greenfield & Sacks, P.C.

(57) ABSTRACT

A cable includes a cable part including at least one set of signal cables for differential transmission, a ground cable, and a power cable, and a first connector and a second connector arranged at both ends of the cable part. At least one of the first connector and the second connector has a common-mode choke coil connected to the ground cable and the power cable.

9 Claims, 8 Drawing Sheets

(51) Int. Cl.
  *H01B 9/00*      (2006.01)
  *H01R 13/6581*   (2011.01)
  *H03H 7/01*      (2006.01)
  *H05K 9/00*      (2006.01)
  *H01R 13/66*     (2006.01)
  *H01B 11/10*     (2006.01)
  *H01R 24/60*     (2011.01)
  *H01R 107/00*    (2006.01)

(52) U.S. Cl.
  CPC .......... *H01R 13/6633* (2013.01); *H01R 24/60* (2013.01); *H01R 2107/00* (2013.01)

(56) References Cited

U.S. PATENT DOCUMENTS

| | | | |
|---|---|---|---|
| 7,249,962 | B2 | 7/2007 | Milette et al. |
| 7,285,020 | B2 | 10/2007 | Riku |
| 9,172,433 | B2 | 10/2015 | Schwager |
| 10,038,290 | B2 | 7/2018 | Chung et al. |
| 2007/0087589 | A1 | 4/2007 | Riku |
| 2007/0291462 | A1 | 12/2007 | Peng |
| 2012/0189068 | A1 | 7/2012 | Körner |
| 2015/0357087 | A1 | 12/2015 | Sumi et al. |
| 2017/0236622 | A1 | 8/2017 | Yoshino et al. |
| 2019/0013630 | A1 | 1/2019 | Yoshino et al. |

FOREIGN PATENT DOCUMENTS

| | | |
|---|---|---|
| CN | 103682934 A | 3/2014 |
| JP | 2001-110254 A | 4/2001 |
| JP | 3306044 B2 | 5/2002 |
| JP | 2002-190412 A | 7/2002 |
| JP | 2005-228694 A | 8/2005 |
| JP | 2007-109587 A | 4/2007 |
| JP | 2007-159069 A | 6/2007 |
| JP | 2011-018505 A | 1/2011 |
| WO | WO 2016/063520 A1 | 4/2016 |

OTHER PUBLICATIONS

Chinese Office Action dated Jun. 28, 2019 in connection with Chinese Application No. 201680078159.2 and English translation thereof.

Extended European Search Report dated Nov. 7, 2018 in connection with European Application No. 16884840.6.

International Search Report and Written Opinion and English translations thereof dated Nov. 22, 2016 in connection with International Application No. PCT/JP2016/004655.

International Preliminary Report on Patentability and English translation thereof dated Jul. 26, 2018 in connection with International Application No. PCT/JP2016/004655.

Communication pursuant to Article 94(3) EPC dated Jun. 5, 2020 in connection with European Application No. 16884840.6.

Japanese Office Action dated Mar. 17, 2020 in connection with Japanese Application No. 2017-561062, and English translation thereof.

Chinese Office Action dated Sep. 27, 2020 in connection with Chinese Application No. 201680078159.2, and English translation thereof.

CABLE

TECHNICAL FIELD

The present disclosure relates to a cable, such as USB (Universal Serial Bus), that conforms to the standard for differential serial transmission.

BACKGROUND ART

The cable (USB cable) conforming to the USB standard includes a pair of cables for differential transmission, a power cable, and a ground cable (called GND cable hereinafter). The USB cable has countermeasures against noise detrimental to the differential transmission cables. An example of this is found in PTL 1 which discloses a method of suppressing radiation noise by arranging one transmission transformer near one terminal of the paired differential transmission line.

CITATION LIST

Patent Literature

[PTL 1]
Japanese Patent No. 3306044

SUMMARY

Technical Problem

The USB cable is occasionally used not only for data transmission but also for power supply from a power supply unit (such as battery charger and personal computer (called "PC" hereinafter), etc.) to various devices (such as smart phone and tablet) by connecting the power supply unit and the devices. Under such a situation, the absence of an effective anti-noise measure in the power supply unit sometimes makes the power-receiving device suffer noise originating from the power supply unit.

It is an object of the present disclosure to provide a cable capable of noise suppression.

Solution to Problem

The present disclosure discloses a cable including a cable part having at least one set of signal cables for differential transmission, a ground cable, and a power cable; and a first connector and a second connector arranged at both ends of the cable part, in which at least one of the first connector and the second connector has a common-mode choke coil connected to the ground cable and the power cable.

Advantageous Effect of Invention

As mentioned above, according to the present disclosure, the cable disclosed therein has a ground cable and a power cable each connected to a common-mode choke coil, so that it is capable of noise suppression.

DESCRIPTION OF EMBODIMENT

The following describes an embodiment of the present disclosure with reference to the accompanying drawings. The description proceeds in the following order.
1. Constitution of USB Cable
2. Method for Producing USB Cable
3. Modified Embodiment

1. Constitution of USB Cable

Figure 1:
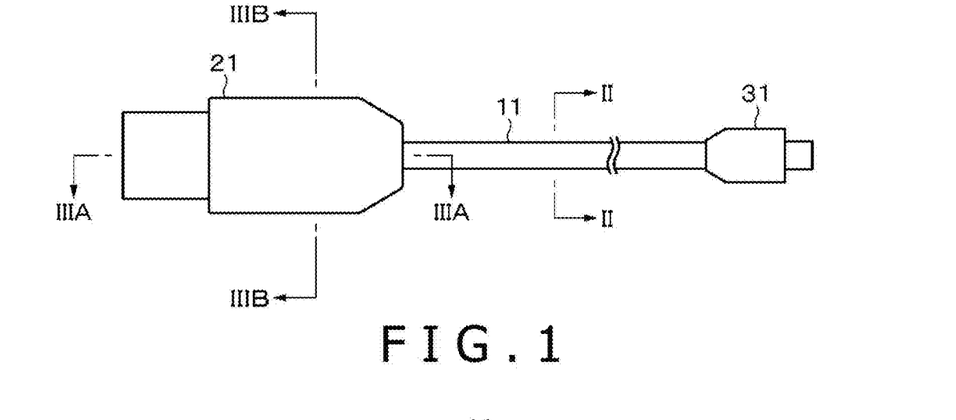
FIG. 1 is a schematic diagram of a USB cable pertaining to one embodiment of the present disclosure.

A USB cable pertaining to one embodiment of the present disclosure is constructed as depicted in FIG. 1. The USB cable includes a cable part 11, a standard USB connector (Type-A) 21 connected to one end of the cable part 11, and a micro (abbreviated as "μ" hereinafter) USB connector (Type-A) 31 connected to the other end of the cable part 11. The standard USB connector (simply called "USB connector" hereinafter) 21 is connected to a host side (such as PC, battery charger (so-called AC adapter), etc.) and the μUSB connector 31 is connected to a device side (such as smartphone and tablet).

(Cable Part)

Figure 2:
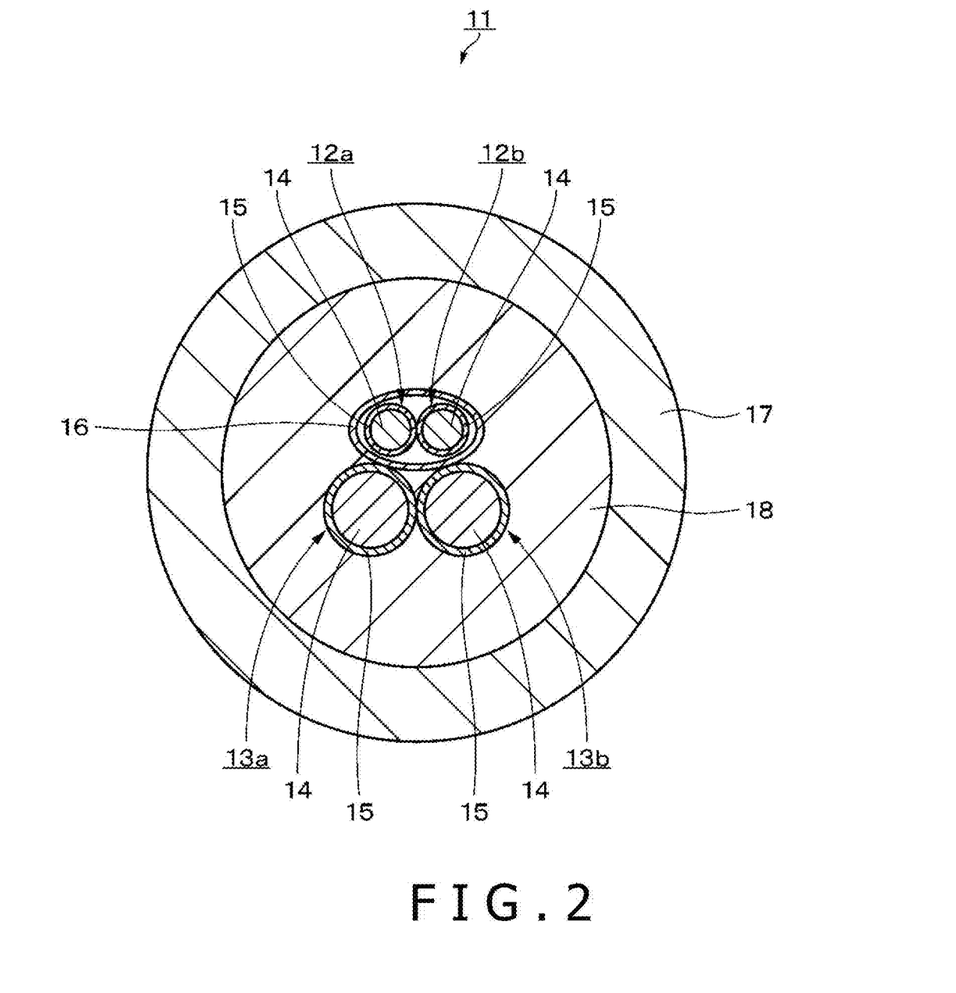
FIG. 2 is a sectional view of a cable part taken along a line II-II in FIG. 1.

The cable part 11, depicted in FIG. 2, includes four cables (electric cable) having one pair of signal cables 12a and 12b for differential-mode transmission (differential mode), a power cable 13a, and a GND cable 13b. Each of these cables 12a, 12b, 13a, and 13b includes a conductor 14 as a core and an insulating coating 15 surrounding it.

The conductor 14 may be either a solid wire of copper or a stranded wire of copper. In a case where the stranded wire is used, to ensure the tensile strength and the flexibility of the wire, the stranded wire may be one which is formed by twisting the core of copper wires and the covering thread of aramide fiber, with a layer of insulating resin covering them. This structure is applicable to any of the signal cables 12a and 12b, the power cable 13a, and the GND cable 13b. The signal cables 12a and 12b may be in the form of twisted pair, for example.

The signal cables 12a and 12b are covered with a metal sheet 16, which may be a copper or aluminum foil placed thereon or a copper or aluminum ribbon wound around them, with both structures combined together optionally. The metal sheet 16, which is not earthed, has the advantage of being free from the problem of bigtail that results from using a braided wire.

A covering layer 17 covers the signal cables 12a and 12b which are covered with the metal sheet 16, the power cable 13a, and the GND cable 13b. The covering layer 17 has its inside filled with a resin containing magnetic powder 18. The resin containing magnetic powder 18 exists in the space between the inner surface of the covering layer 17 and the bunch of the signal cables 12a and 12b, the power cable 13a, and the GND cable 13b. The signal cables 12a and 12b, which are covered with the metal sheet 16, is able to transmit signals without being affected by the resin containing magnetic powder 18.

As the insulating coating 15 covering the conductors 14 and the covering layer 17, a variety of materials are used. For example, materials such as polyethylene, polypropylene, PVC (polyvinyl chloride), and elastomer may be used.

The resin containing magnetic powder 18 is a mixture of a synthetic resin and a magnetic powder. The synthetic resin includes, for example, styrene elastomer. A synthetic resin such as olefin elastomer and PVC other than styrene elastomer may be used. The magnetic powder includes, for example, Ni—Zn ferrite. As the magnetic powder, Ni—Cu—Zn ferrite, Mn—Zn ferrite, and soft magnetic metal may be used, and other magnetic powder based on such metals as copper, magnesium, lithium, zinc, iron (e.g., permalloy), and cobalt may also be used.

The resin containing magnetic powder 18 preferably contains ferrite in an amount equal to or more than 70 wt % and equal to or less than 95 wt %, typically 89 wt %. Ferrite in an amount equal to or more than 70 wt % is particularly effective in absorption of high-frequency noise. On the other hand, ferrite in an amount equal to or less than 95 wt % is effective in reducing adverse effects on moldability, flexibility, and mechanical properties such as tensile strength.

(Connector)

An example of the constitution of the USB connector 21 will be described below with reference to FIGS. 3A 3B, 4A, and 4B. The USB connector 21 includes a printed circuit board 22, a plug 23 supported on the printed circuit board 22, and a molded part 24 that covers the printed circuit board 22 supporting the plug 23. The molded part 24 has the plug 23 protruding from one end thereof and also has the cable part 11 derived from the other end thereof.

The printed circuit board 22 has on one side thereof terminals 25a and 25d, a common-mode choke coil (called common-mode filter occasionally) 26 for power source, and the capacitor (condenser) for noise removal (not depicted). The terminals 25a and 25d have the power cable 13a and the GND cable 13b connected thereto respectively. The printed circuit board 22 has on the other side thereof terminals 25b and 25c and a common-mode choke coil 27. The terminals 25b and 25c are connected to the signal cables 12a and 12b respectively.

The printed circuit board 22 has terminals 28a, 28b, 28c, and 28d, and the terminals 28a, 28b, 28c, and 28d extend from the substantially center to one end thereof. The plug 23 is supported on the printed circuit board 22 such that it covers that part of the printed circuit board 22 on which the terminals 28a, 28b, 28b, and 28c are formed.

The molded part 24 includes an insulating resin layer 24a and an electromagnetic wave shielding layer 24b, with the former functioning as an inner molded part that encloses the surrounding of the printed circuit board 22 and the latter functioning as an outer molded part that covers the surrounding of the insulating resin layer 24a. The insulating resin layer 24a includes an insulating polymeric resin such as polypropylene, and the electromagnetic wave shielding layer 24b includes carbon or ferrite and a polymeric resin capable of shielding, such as absorbing or reflecting, electromagnetic waves.

The cable part 11 has on one end thereof the signal cables 12a and 12b, the power cable 13a, and the GND cable 13b, with their parts exposed without being covered by the covering layer 17 and the resin containing magnetic powder (these parts will be called "uncovered parts" hereinafter). The uncovered parts of the cables 12a, 12b, 13a, and 13b are embedded in the insulating resin layer 24a.

The signal cables 12a and 12b have the uncovered parts at one end thereof formed such that they are shorter than the uncovered parts at one end of the power cable 13a and the GND cable 13b so that they do not come into contact with the electromagnetic wave shielding layer 24b. This prevents signals from attenuating due to contact of the electromagnetic wave shielding layer 24b with the uncovered parts of the signal cables 12a and 12b. In order to avoid contact between the electromagnetic wave shielding layer 24b and the uncovered parts of the signal cables 12a and 12b, it is desirable that the uncovered parts of the signal cables 12a and 12b extend almost straight toward their respective terminals 25b and 25c.

The signal cables 12a and 12b may be constructed such that the uncovered parts thereof are covered with an insulating covering material 12c. This avoids contact between the electromagnetic wave shielding layer 24b and the uncovered parts of the signal cables 12a and 12b. The insulating covering material 12c includes, for example, an insulating tube, an insulating tape, an insulating film, a heat-shrinkable tube, a heat-shrinkable tape, and a heat-shrinkable film.

The μUSB connector 31 is constructed in the similar way to the USB connector 21 mentioned above, such that the printed circuit board is covered with the molded part.

Figure 5:
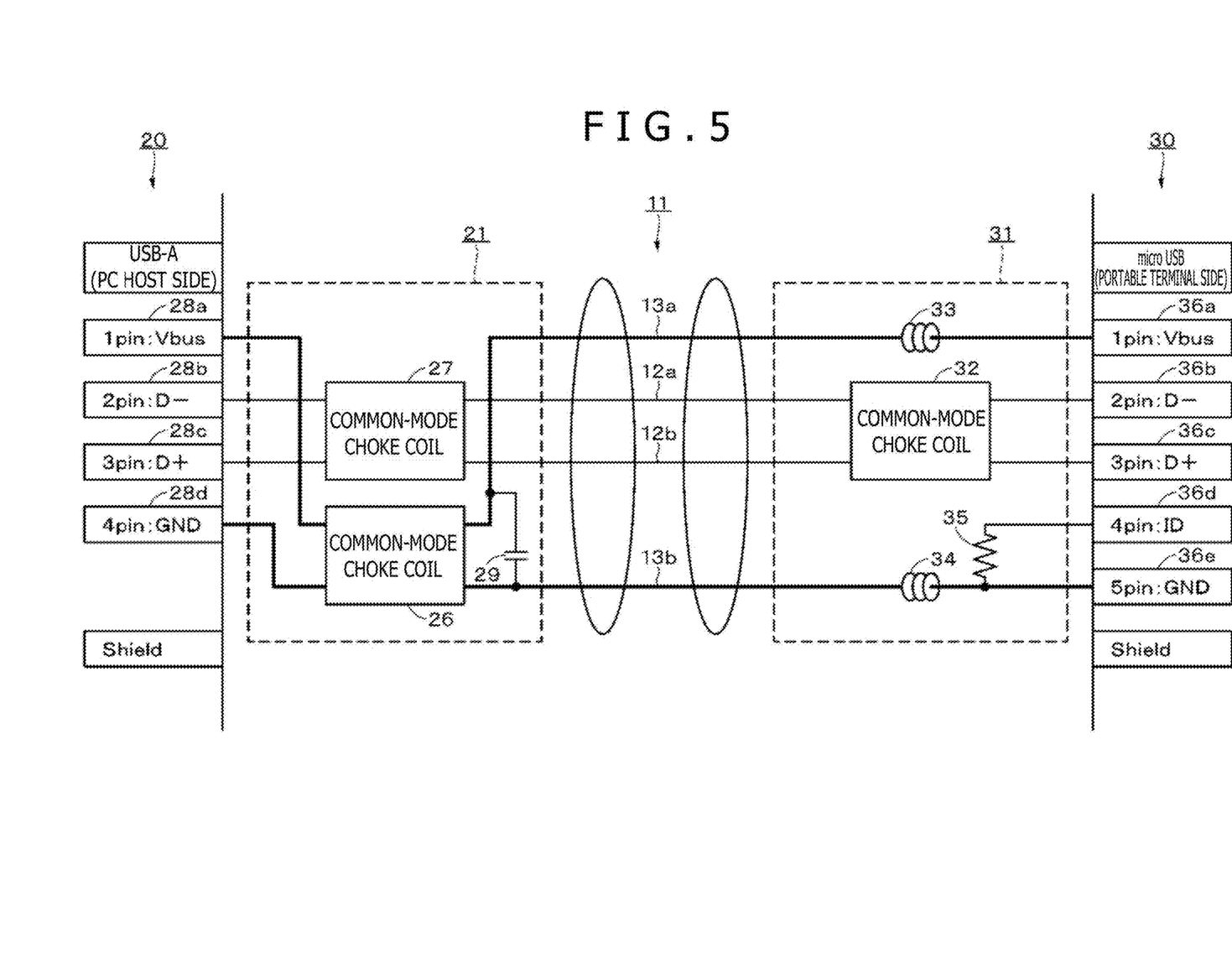
FIG. 5 is a connection diagram of the USB cable pertaining to one embodiment of the present disclosure.

As depicted in FIG. 5, for example, the USB connector 21 is connected to the receptacle of a host 20, and the iUSB connector 31 is connected to the receptacle of a portable terminal 30. The terminals 28a, 28b, 28c, and 28d of the USB connector 21 are a source terminal (pin 1: Vbus terminal), a data terminal (pin 2: D−terminal), a data terminal (pin 3: D+terminal), and a ground terminal (pin 4: GND terminal), respectively. Terminals 36a, 36b, 36c, 36d, and 36e of the μUSB connector 31 are a source terminal (pin 1: Vbus terminal), a data terminal (pin 2: D−terminal), a data terminal (pin3: D+terminal), an identifying terminal (pin4: ID terminal), and a ground terminal (pin 5: GND terminal), respectively.

The USB connector 21 has its terminals 28b and 28c connected to respective two terminals on one side of the common-mode choke coil 27. Two terminals on the other side of the common-mode choke coil 27 are connected to two terminals on one side of a common-mode choke coil 32 arranged in the μUSB connector 31 through the signal cables 12a and 12b. Two terminals on the other side of the common-mode choke coil 32 are connected to the terminals 36b and 36c.

The USB connector 21 has its terminals 28a and 28d connected to two terminals on one side of the common-mode choke coil 26. A capacitor (condenser) 29 for noise removal is inserted between two terminals on the other side of the common-mode choke coil 26. The two terminals on the other side of the common-mode choke coil 26 are connected to the terminals 36a and 36e of the pUSB connector 31 through the power cable 13a and the GND cable 13b. The pUSB connector 31 includes ferrite beads 33 and 34. The ferrite beads 33 and 34 are arranged respectively in the power cable 13a and the GND cable 13b in the pUSB connector 31. A resistor 35 for identification is connected to the terminals 36d and 36e.

The signal cables 12a and 12b have two common-mode choke coils 27 and 32 inserted therein; however, one of them may be omitted. The pUSB connector 31 may be modified in constitution such that the power cable 13a and the GND cable 13b are connected to the common-mode choke coils in place of the ferrite beads 33 and 34. Incidentally, in the case of the USB connector conforming to the Type-C standard, both cables connected to the host side and the device side allow power supply. In this case it is desirable to provide both connector sides with the common-mode choke coils connected to the power cable 13a and the GND cable 13b.

Each of the common-mode choke coils 26, 27, and 32 includes one common core and two coils wound thereon in the opposite directions. The common-mode choke coils 27 and 32 are inserted into each of the signal cables 12a and 12b as two data lines. The common-mode choke coil 26 is inserted into each of cables including the power cable 13a and the GND cable 13b as two power supply lines.

The common-mode choke coils 26, 27, and 32 permit the passage of signal currents in differential mode and remove noise current in a common mode. That is, in the case of the differential mode, the two coils cause the currents to flow in the opposite directions, so that they do not function as an inductor. By contrast, in the case of the common mode, the two coils cause the currents to flow in the same direction, so that they function as the inductor. Being in the common mode, noise can be removed. In fact, however, the inductance component does not become null because part of a magnetic flux occurring in each coil becomes a leakage flux. Consequently, there is an instance in which this inductance component is non-negligible in a region where a signal frequency is extremely high. Moreover, it is possible to remove noise by means of the capacitor 29 for noise removal. It is also possible to remove high-frequency noise by means of the ferrite beads 33 and 34.

The foregoing enhanced performance on noise reduction in power transmission prevents the portable terminal 30 from decreasing in a reception level due to noise occurring in the battery charger and PC to which the USB connector 21 is connected.

Figure 6:
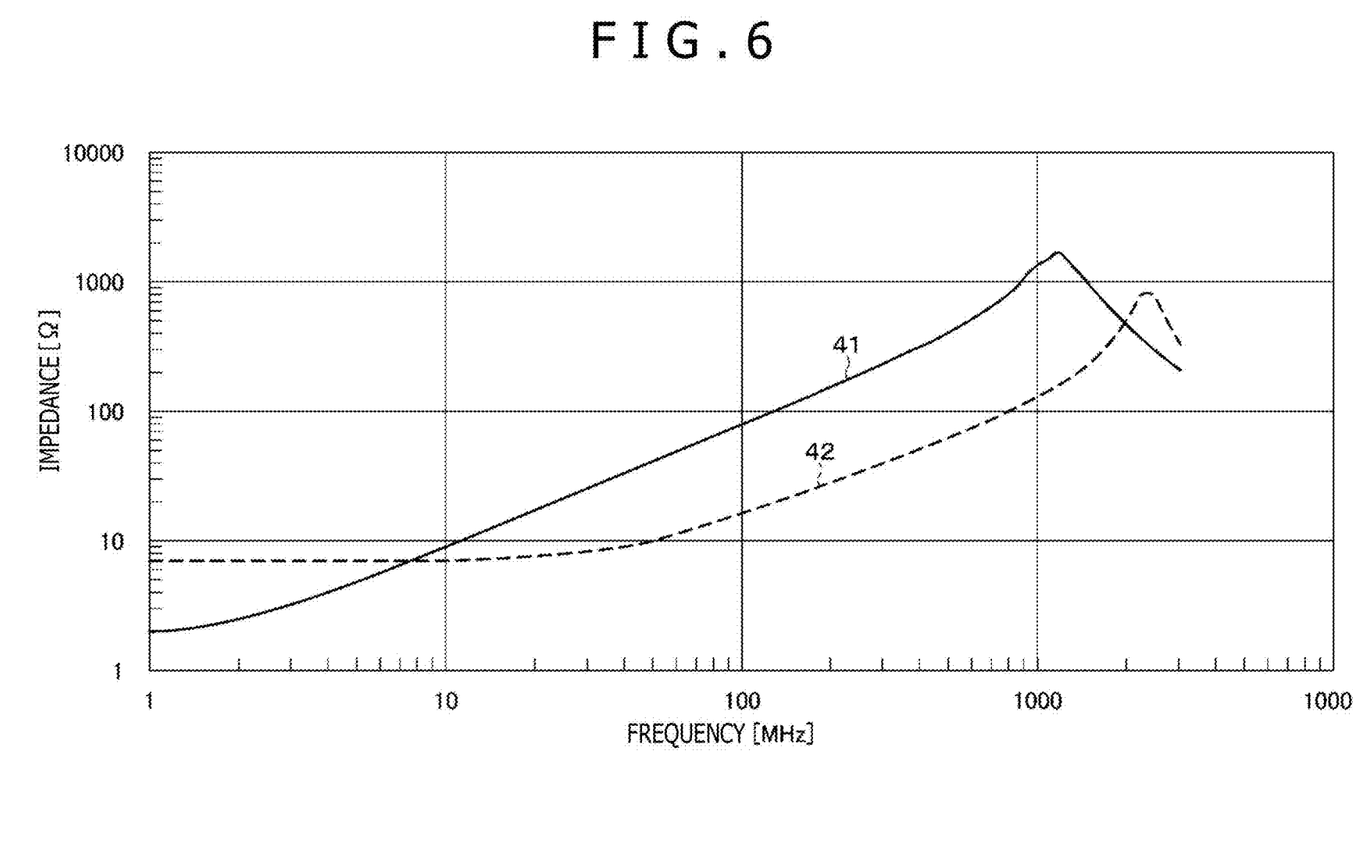
FIG. 6 is a graph depicting impedance-frequency characteristics of a common-mode choke coil for signals.

Impedance-frequency characteristics of the common-mode choke coil 27 (or 32) for signals is depicted in FIG. 6. A solid line 41 denotes impedance-frequency characteristics in the common mode. A broken line 42 denotes impedance-frequency characteristics in the differential mode. It is to be noted, for example, that the impedance in the differential mode is low in the neighborhood of 100 MHz. This suggests that the effect on signal transmission is insignificant.

Figure 7:
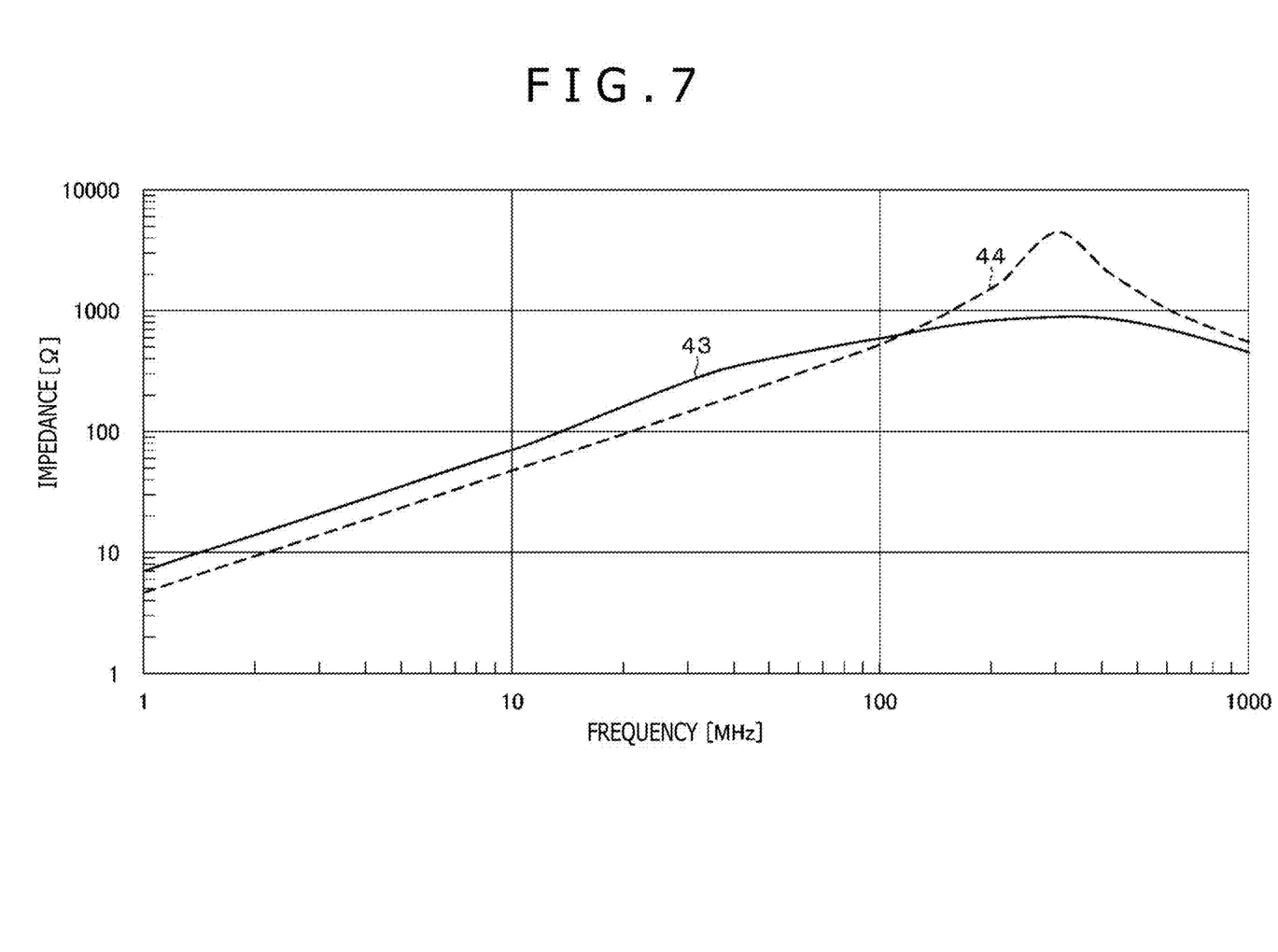
FIG. 7 is a graph depicting impedance-frequency characteristics of a common-mode choke coil for power supply.

Impedance-frequency characteristics of the common-mode choke coil 26 for power supply are depicted in FIG. 7. A solid line 43 denotes impedance-frequency characteristics in the common mode. A broken line 44 denotes impedance-frequency characteristics in the differential mode. It is to be noted, for example, that the impedance in both the common mode and the differential mode is comparatively high in the neighborhood of 100 MHz. This suggests that it is possible to suppress the high-frequency components (or noise) in both of the modes.

Figure 8:
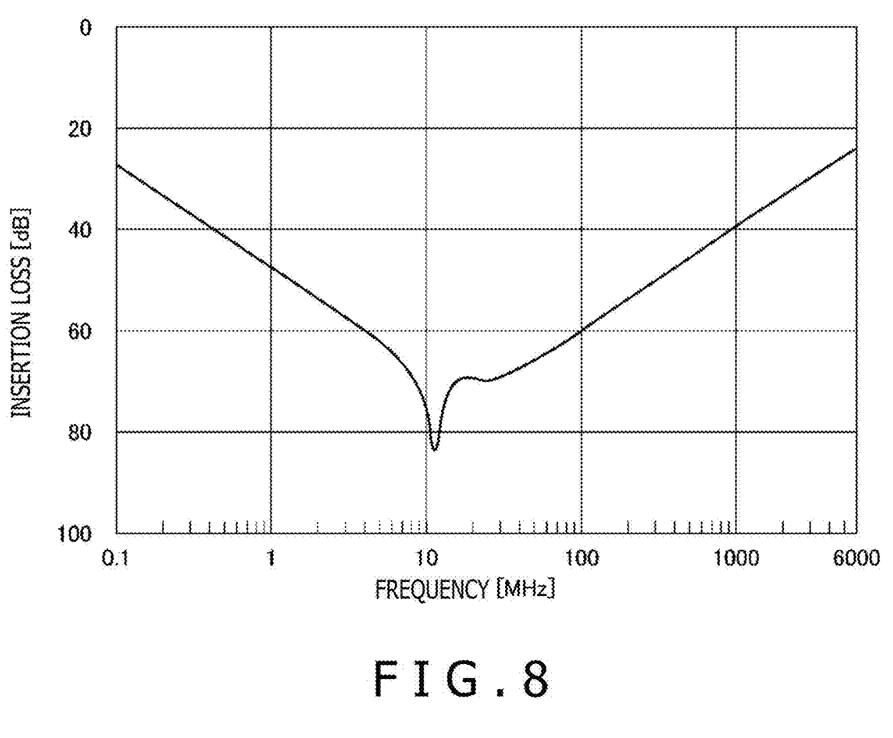
FIG. 8 is a graph depicting frequency characteristics for the loss that occurs as a result of inserting a capacitor for noise removal.

Insertion loss-frequency characteristics of the capacitor 29 for noise removal are depicted in FIG. 8. This indicates that the capacitor 29 having a capacitance of 1.5 μF effectively suppresses noise.

Figure 9:
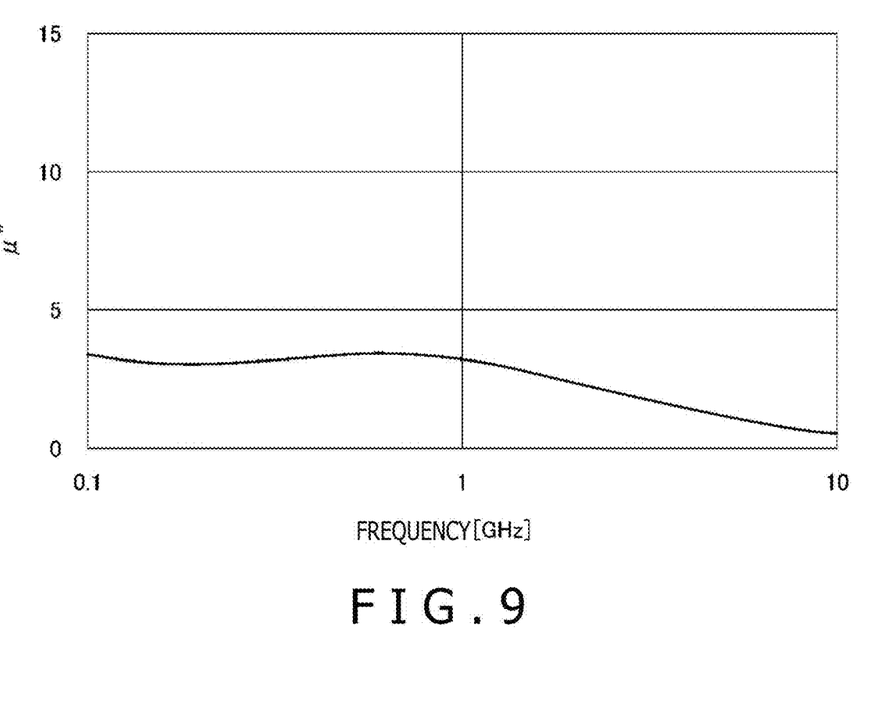
FIG. 9 is a graph depicting frequency characteristics for a loss factor of a molded part.

FIG. 9 depicts frequency characteristics for a loss factor μ" of the electromagnetic wave shielding layer 24b containing ferrite and polymeric resin. Incidentally, the polymeric resin is polypropylene and the electromagnetic wave shielding layer 24b contains ferrite in an amount of 80 wt %. It is noted from FIG. 9 that the loss factor μ" is as low as approximately 4 in the low-frequency range.

2. Method for Producing USB Cable

The following is a description of a method for producing the USB cable constructed as mentioned above.

Figure 3A:
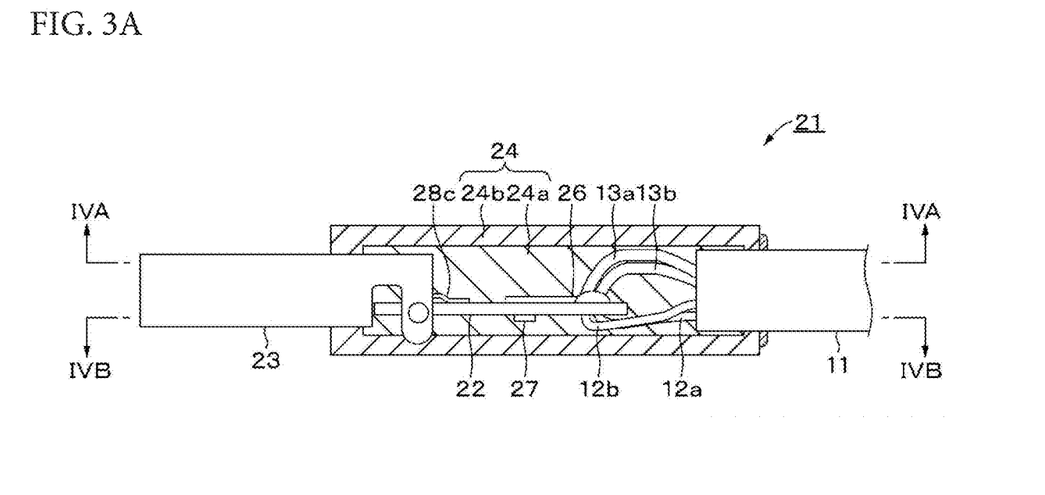
FIG. 3A is a sectional view of a USB connector taken along a line IIIA-IIIA in FIG. 1.
Figure 3B:
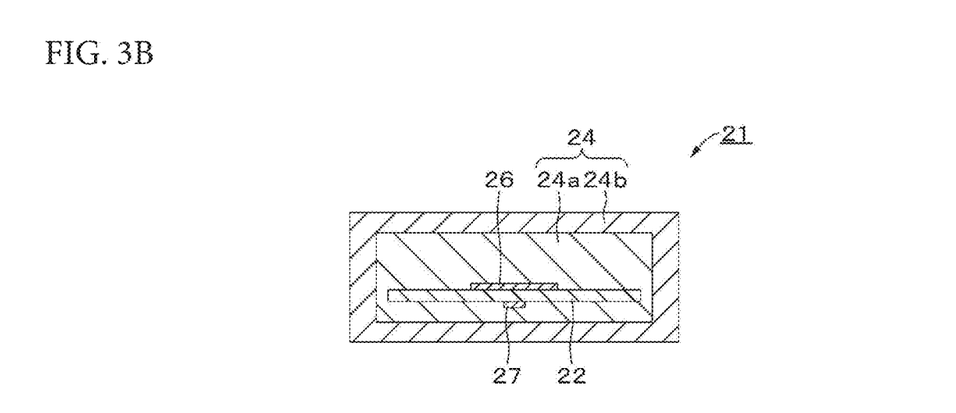
FIG. 3B is a sectional view of the USB connector taken along a line IIIB-IIIB in FIG. 1.
Figure 4A:
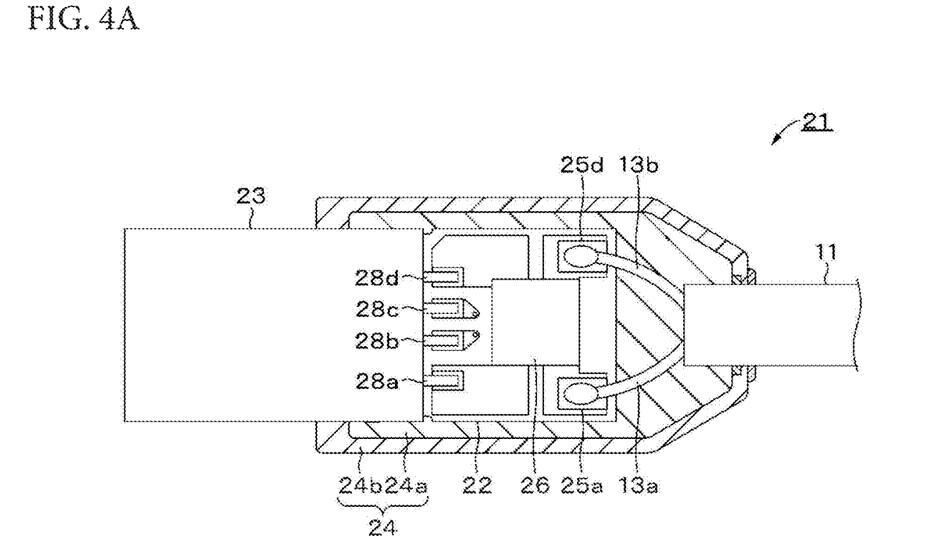
FIG. 4A is a sectional view of the USB connector taken along a line IVA-IVA in FIG. 3A.
Figure 4B:
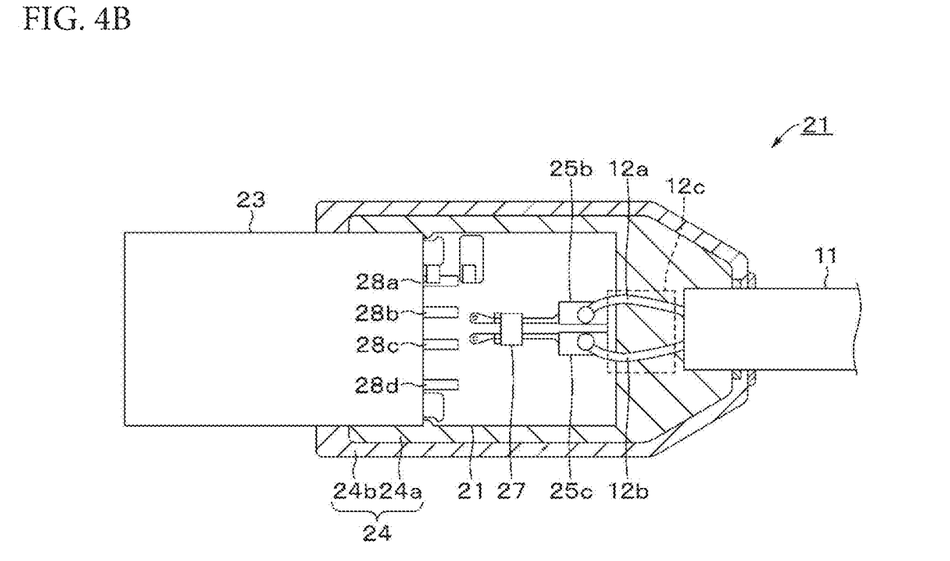
FIG. 4B is a sectional view of a connector taken along a line IVB-IVB in FIG. 3A.

The USB connector 21 is produced in the following manner. The printed circuit board 22 is provided thereon with the common-mode choke coils 26 and 27 as chip parts (noise filter) for anti-noise measure. The power cable 13a and the GND cable 13b are connected to the terminals 25a and 25d of the printed circuit board 22 respectively by soldering. Also, the signal cables 12a and 12b are connected to the terminals 25b and 25c of the printed circuit board 22 respectively by soldering. Then, the insulating resin layer 24a as the inner molded part is formed by molding so that it fills the space around the printed circuit board 22. Similarly, the insulating resin layer 24a is subsequently surrounded with the magnetic wave shielding layer 24b as the outer molded part which is formed by molding. In this way, there is obtained the USB connector 21.

The pUSB connector 31 is also produced by molding in the similar way to the USB connector 21 mentioned above.

The above-mentioned method for producing the USB cable saves time for production of the USB cable because the USB connector 21 is prepared simply by covering the printed circuit board 22 with resin by molding. Also, covering the printed circuit board 22 with resin without any gap results in an improved shielding performance.

3. Modified Embodiment

The foregoing is a detailed description of the embodiment of the present disclosure. The present embodiment mentioned above is not intended to restrict the scope of the present disclosure. Various changes can be made without departing from the scope of the present disclosure. The constitution, method, process, shape, materials, and numerical values cited in the present embodiment mentioned above are mere examples and variously modified as needed.

What is disclosed herein is applicable to the cable or connector conforming to the standard for USB Type-C. It is applicable not only to the USB cable but also to HDMI (registered trademark) cable and IEEE (Institute of Electrical and Electronics Engineers) 1394 cable. The cable part may be the ordinary USB cable.

Figure 10:
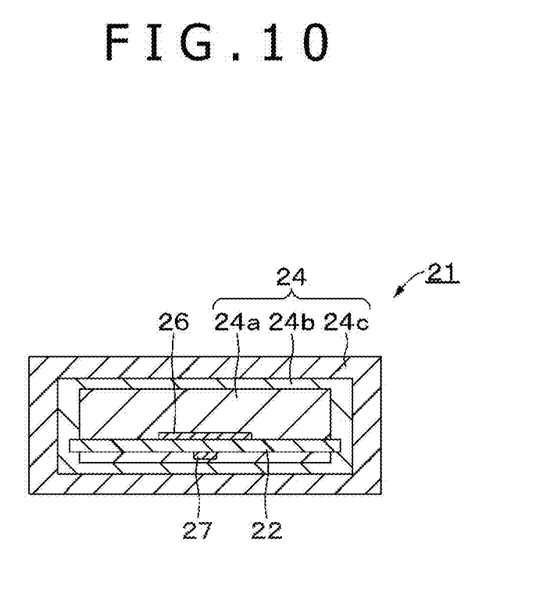
FIG. 10 is a sectional view of a USB connector pertaining to a modified embodiment of the present disclosure.

In addition, the molded part 24 further has the insulating resin layer 24c surrounding the electromagnetic wave shielding layer 24b as depicted in FIG. 10. The insulating resin layer 24c includes an insulating polymeric resin such as polypropylene. The insulating resin layer 24c added to the molded part 24 realizes the improved shielding performance.

Further, the molded part has the insulating resin layer only. In this case, the insulating resin layer may have a configuration to fill the space surrounding the printed circuit board or the insulating resin layer may have a cavity around the printed circuit board.

Further, both the common-mode choke coil for power supply and the common-mode choke coil for signals are mounted on the same plane of the printed circuit board.

Note that the present disclosure may be configured as follows.

(1)
A cable including:
a cable part including at least one set of signal cables for differential transmission, a ground cable, and a power cable; and
a first connector and a second connector arranged at both ends of the cable part,
in which at least one of the first connector and the second connector has a common-mode choke coil connected to the ground cable and the power cable.

(2)
The cable according to Paragraph (1) above, in which the common-mode choke coil is effective in noise removal not only in a common mode but also in a differential mode.

(3)
The cable according to Paragraph (1) or (2) above, in which a connector having the common-mode choke coil further has a condenser for noise removal which is placed between the ground cable and the power cable.

(4)
The cable according to any one of Paragraphs (1) to (3) above, in which a connector having the common-mode choke coil further has a substrate having the common-mode choke coil mounted thereon and an insulating resin layer covering the substrate.

(5)
The cable according to Paragraph (4) above, in which the connector having the common-mode choke coil further has an electromagnetic wave shielding layer covering the insulating resin layer.

(6)
The cable according to Paragraph (5) above, in which the electromagnetic wave shielding layer contains carbon or ferrite.

(7)
The cable according to Paragraph (5) or (6) above, in which the one set of signal cables is installed such that the one set of signal cables does not come into contact with the electromagnetic wave shielding layer.

(8)
The cable according to any one of Paragraphs (5) to (7) above, in which, on a side of the connector having the electromagnetic wave shielding layer, one end of the one set of signal cables is shorter than one end of the ground cable and the power cable.

(9)
The cable according to any one of Paragraphs (5) to (8) above, in which, on a side of the connector having the electromagnetic wave shielding layer, one end of the one set of signal cables is covered with an insulating covering material.

(10)
The cable according to any one of Paragraphs (1) to (9) above, in which one of the first connector and the second connector has the common-mode choke coil connected to the ground cable and the power cable, and the other of them has a ferrite bead arranged in the ground cable and the power cable.

(11)
The cable according to any one of Paragraphs (1) to (10) above, in which at least one of the first connector and the second connector further has a common-mode choke coil connected to the one set of signal cables.

REFERENCE SIGNS LIST

11 Cable part
12a, 12b Signal cable
13a Power cable
13b GND cable
21 USB connector (first connector)
31 USB connector (second connector)
22 Printed circuit board
23 Plug
24 Molded part
24a Insulating resin layer
24b Electromagnetic wave shielding layer
26, 27 Common-mode choke coil
29 Capacitor

The invention claimed is:

1. A cable comprising:
a cable part including at least one set of signal cables for differential transmission, a ground cable, and a power cable; and
a first connector arranged at one end of the cable part and a second connector arranged at the other end of the cable part,
wherein at least one of the first connector and the second connector has at least one common-mode choke coil connected to the ground cable and the power cable,
wherein the first connector having the at least one common-mode choke coil further has a substrate having terminals and one common-mode choke coil mounted on one side of the substrate and terminals and another common-mode choke coil mounted on the other side of the substrate and an insulating resin layer covering the substrate,
wherein the first connector having the one common-mode choke coil further has a condenser for noise removal,
wherein the terminals are connected to the power cable and the ground cable respectively and the terminals are connected to the at least one set of signal cables; and
wherein one of the first connector and the second connector has the common-mode choke coil connected to the ground cable and the power cable, and the other of them has a ferrite bead arranged in the ground cable and the power cable.

2. The cable according to claim 1, wherein the common-mode choke coil is provided for noise removal in a common mode and in a differential mode.

3. The cable according to claim 1, wherein the condenser for noise removal is placed between the ground cable and the power cable.

4. The cable according to claim 1, wherein the first connector having the common-mode choke coil further has an electromagnetic wave shielding layer covering the insulating resin layer.

5. The cable according to claim 4, wherein the electromagnetic wave shielding layer (24b) contains carbon or ferrite.

6. The cable according to claim 4, wherein the one set of signal cables is installed such that the one set of signal cables does not come into contact with the electromagnetic wave shielding layer.

7. The cable according to claim 6, wherein, on a side of the first connector having the electromagnetic wave shielding layer, one end of the one set of signal cables is shorter than one end of the ground cable and the power cable.

8. The cable according to claim 4, wherein, on a side of the first connector having the electromagnetic wave shielding layer, one end of the one set of signal cables is covered with an insulating covering material.

9. The cable according to claim 1, wherein at least one of the first connector and the second connector further has a common-mode choke coil connected to the one set of signal cables.

\* \* \* \* \*